United States Patent
Choi (10) Patent No.: US 8,143,163 B2
(45) Date of Patent: Mar. 27, 2012

(54) METHOD FOR FORMING PATTERN OF SEMICONDUCTOR DEVICE

(75) Inventor: Jae Seung Choi, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 989 days.

(21) Appl. No.: 12/119,173

(22) Filed: May 12, 2008

(65) Prior Publication Data

US 2009/0170318 A1 Jul. 2, 2009

(30) Foreign Application Priority Data

Dec. 26, 2007 (KR) ................ 10-2007-0137989

(51) Int. Cl.
*H01L 21/311* (2006.01)

(52) U.S. Cl. ........ 438/689; 438/692; 438/697; 438/720; 257/E21.237

(58) Field of Classification Search .............. None
See application file for complete search history.

(56) References Cited

U.S. PATENT DOCUMENTS 7,202,174 B1 4/2007 Jung et al. ................ 438/694

FOREIGN PATENT DOCUMENTS

| KR | 10-0714305 | 4/2007 |
|---|---|---|
| KR | 10-2007-0076793 | 7/2007 |
| KR | 10-2008-0029719 | 4/2008 |

OTHER PUBLICATIONS

Notice of Rejection for Korean Application No. 10-2007-0137989, dated Apr. 30, 2009.

*Primary Examiner* — Allan Olsen
(74) *Attorney, Agent, or Firm* — Marshall, Gerstein & Borun LLP (57) ABSTRACT

A method for manufacturing a semiconductor device comprises performing a CMP process using an oxide film as an etching barrier film to maintain a polysilicon layer having a large open area. A word line pattern, a DSL pattern, and a SSL pattern that are formed by a first patterning process are not additionally blocked, and the oxide film is used as an etching barrier to obtain an accurate overlay between patterns and improve CD uniformity, thereby improving a characteristic of the device.

17 Claims, 8 Drawing Sheets

METHOD FOR FORMING PATTERN OF SEMICONDUCTOR DEVICE

CROSS-REFERENCE TO RELATED APPLICATION

Priority to Korean patent application number 10-2007-0137989, filed on Dec. 26, 2007, the disclosure of which is incorporated by reference in its entirety, is claimed.

BACKGROUND OF THE INVENTION

The invention relates generally to a method for forming a pattern of a semiconductor device that can control a fine critical dimension and improve an overlay characteristic of the device.

In the manufacturing of semiconductor devices, the resolution required in the semiconductor device has decreased beyond the minimum resolution that can be resolved using photolithography equipment.

For example, if the minimum resolution is 45 nm when an exposure process is performed using photolithography equipment, the semiconductor device may require a resolution smaller than 40 nm.

Due to the limit of the photolithography equipment, various patterning technologies have been proposed. Of these technologies, a patterning technique using a spacer has been widely used.

FIGS. 1a to 1g are cross-sectional diagrams illustrating a conventional method for forming a pattern of a semiconductor device using spacer patterning technology (SPT).

Figure 1A:
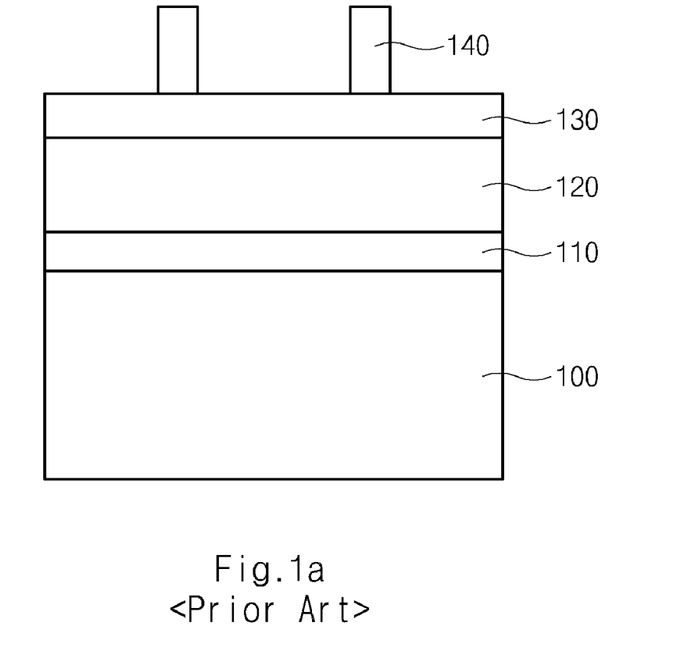
FIGS. 1a to 1g are cross-sectional diagrams illustrating a conventional method for forming a pattern of a semiconductor device.

Referring to FIG. 1a, a nitride film 110, a first polysilicon layer 120, an anti-reflective film 130, and a first photoresist pattern 140 are formed over a semiconductor substrate 100.

The first photoresist pattern 140 is twice as wide as that of a final pattern.

Figure 1B:
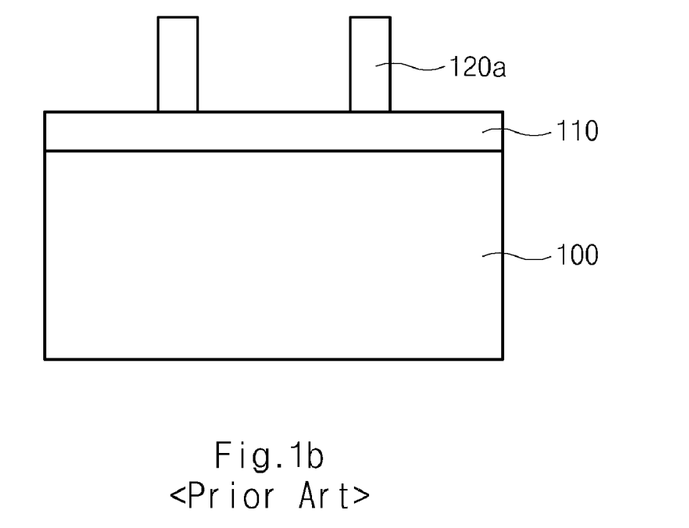

Referring to FIG. 1b, the anti-reflective film 130 and the first polysilicon layer 120 are etched using the first photoresist pattern 140 as a mask to form an anti-reflective pattern (not shown) and a first polysilicon pattern 120a.

The anti-reflective pattern (not shown) and the first photoresist pattern 140 are then removed.

Figure 1C:
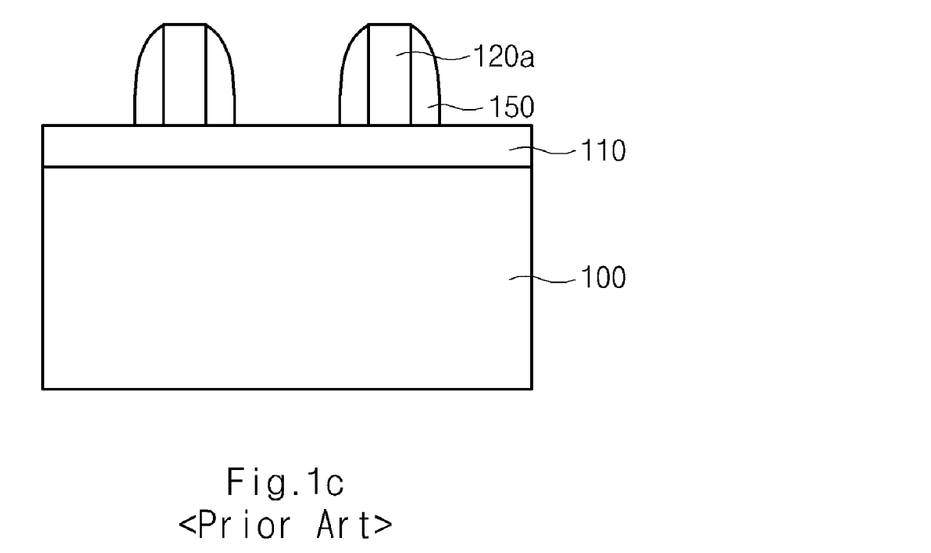

Referring to FIG. 1c, an oxide film (not shown) is deposited over the resulting structure including the first polysilicon pattern 120a. A blanket-etching process is performed to form spacers 150 at sidewalls of the first polysilicon pattern 120a.

The spacers 150 are formed to have a critical dimension (CD) that is the same as that of the first polysilicon pattern 120a.

Figure 1D:
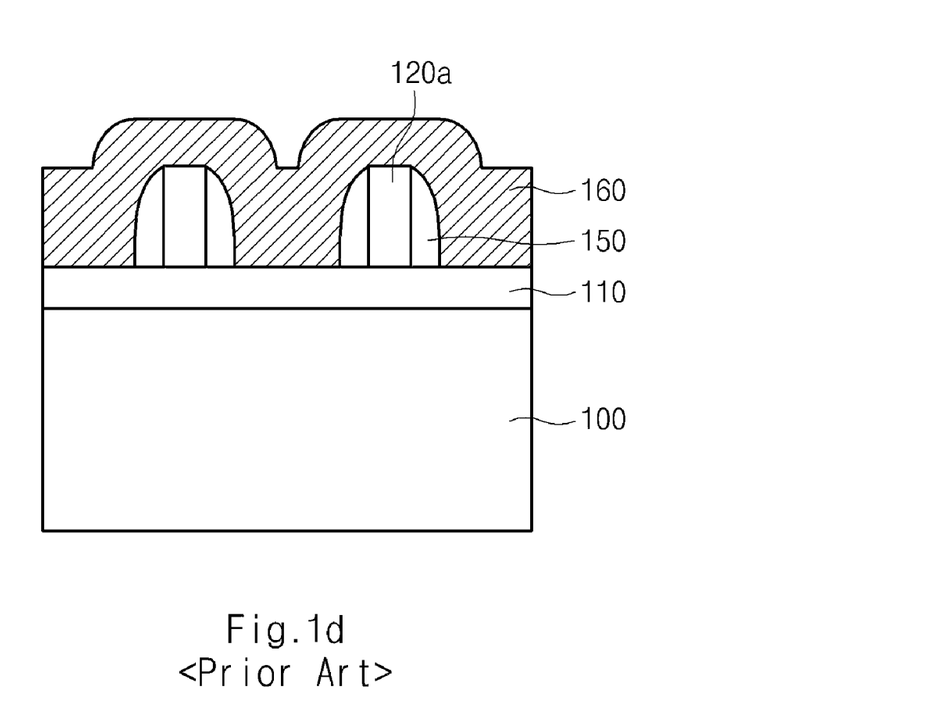

Referring to FIG. 1d, a second polysilicon layer 160 is formed over the resulting structure including the first polysilicon pattern 120a and the spacers 150.

The second polysilicon layer 160 reflects a step difference of the first polysilicon pattern 120a.

Figure 1E:
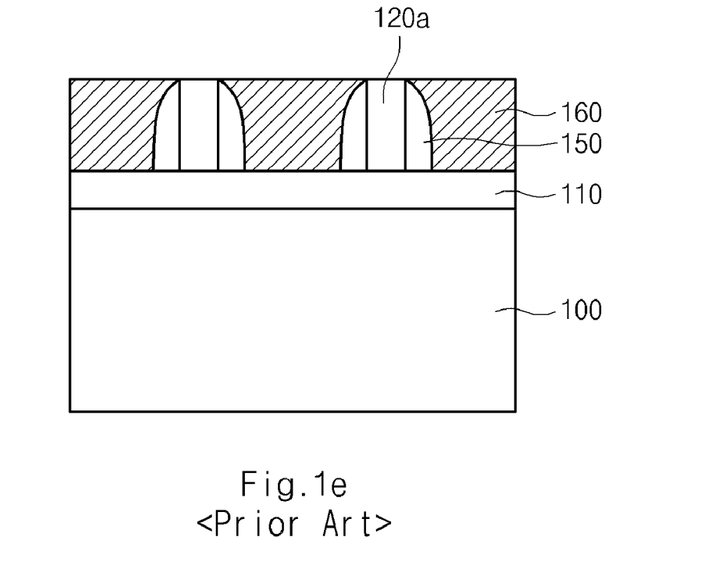

Referring to FIG. 1e, an etch-back process is performed to expose the first polysilicon pattern 120a, so that the second polysilicon layer 160 remains between the spacers 150. The etch-back process is a dry etching process.

After the etch-back process is performed, the second polysilicon layer 160 remains on the sidewalls of the spacers 150. An additional etch process is required to remove the residual second polysilicon layer 160.

The entire second polysilicon layer 160 is etched in a large open area to expose the first polysilicon pattern 120a during the etch-back process. As a result, a pattern cannot be formed in a peripheral circuit region and an inter-connection region during a subsequent patterning process without forming a second photoresist pattern over the cell region.

Figure 1F:
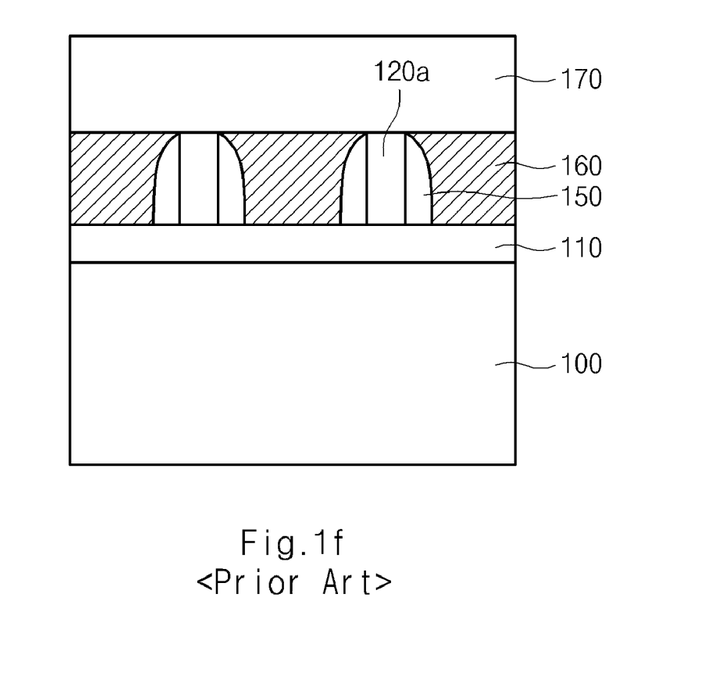

Referring to FIG. 1f, a second photoresist pattern 170 is formed over the resulting structure, including the second polysilicon layer 160 and the first polysilicon pattern 120a. The second photoresist pattern 170 may be formed over a cell region of the semiconductor substrate to allow for patterning of the peripheral circuit region and the inter-connection region.

A process for forming a pattern is then performed on the peripheral circuit region and the inter-connection region (not shown).

Figure 1G:
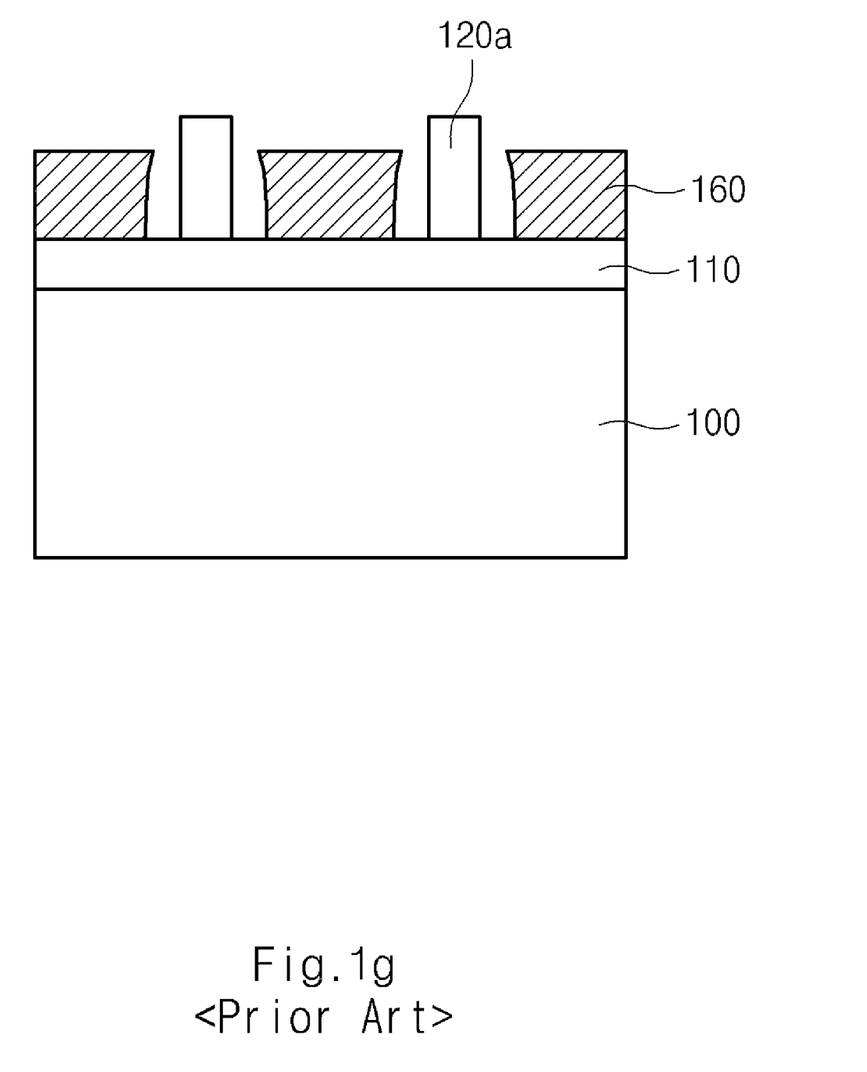

Referring to FIG. 1g, the second photoresist pattern 170 is removed.

The spacers 150 are removed to form a fine pattern including the first polysilicon pattern 120a and the second polysilicon layer 160.

In the above-described conventional method for forming a pattern of a semiconductor device, residual polysilicon remains on sidewalls of the spacer during an etch-back process performed after forming the polysilicon layer, so that a subsequent process for removing the residual polysilicon is required. The entire polysilicon layer having a large open area is etched, so that a subsequent patterning process cannot be performed without forming a second photoresist pattern over the cell region.

BRIEF SUMMARY OF THE INVENTION

Various embodiments of the invention are directed to providing a method for forming a pattern of a semiconductor device having one or more benefits, such as controlling a fine critical dimension and improving an overlay characteristic of the device.

According to an embodiment of the invention, a method for forming a pattern of a semiconductor device comprises: forming a first mask pattern over a semiconductor substrate; forming a spacer film over the resulting structure including the first mask pattern; forming a polysilicon layer over the resulting structure including the spacer film; performing a planarizing process to expose the spacer film; forming a photoresist pattern over a portion of the resulting structure including the planarized polysilicon layer, such that a part of the polysilicon layer is exposed; etching the polysilicon layer with the photoresist pattern as a mask to form a second mask pattern; removing the photoresist pattern; and removing the exposed spacer film.

According to another embodiment of the invention, a method for manufacturing a semiconductor device comprises: forming a hard mask layer and a first polysilicon layer over a semiconductor substrate including a cell region, an inter-connection region, and a peripheral circuit region; etching the first polysilicon layer to form a first mask pattern; forming a spacer film over the resulting structure including the first mask pattern; forming a second polysilicon layer over the resulting structure including the spacer film; performing a planarizing process to expose the spacer film disposed over a top of the first mask pattern; forming a photoresist pattern over a portion of the resulting structure including the planarized second polysilicon layer, so that a part of the second polysilicon layer is exposed; etching the second polysilicon layer using the photoresist pattern as a mask to form a second mask pattern; removing the photoresist pattern; removing the spacer film exposed on sidewalls and the top portion of the first mask pattern; and etching the hard mask layer using the first and second mask patterns as a mask to form a hard mask pattern.

BRIEF DESCRIPTION OF THE DRAWINGS

For a more complete understanding of the disclosure, reference should be made to the following detailed description and accompanying drawings.

DESCRIPTION OF EMBODIMENTS

FIGS. 2a to 2g are cross-sectional diagrams illustrating a method for forming a pattern of a semiconductor device according to an embodiment of the invention.

Figure 2A:
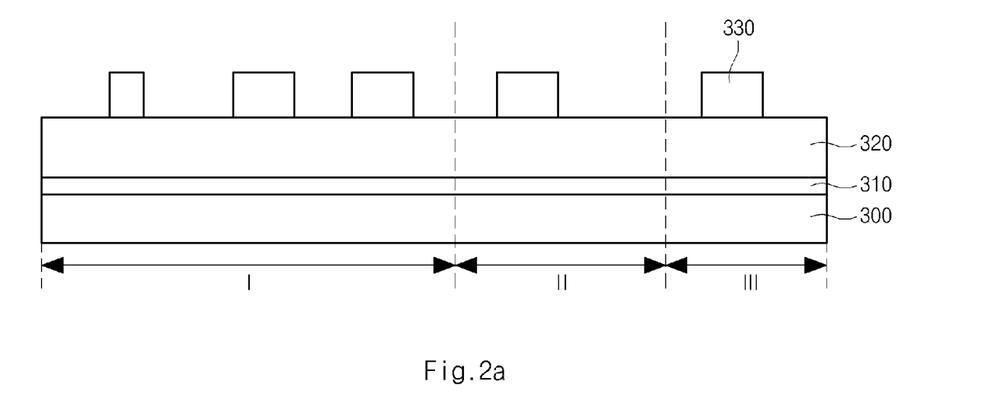
FIGS. 2a to 2g are cross-sectional diagrams illustrating a method for forming a pattern of a semiconductor device according to an embodiment of the invention.

Referring to FIG. 2a, a hard mask layer is formed over a semiconductor substrate (not shown) that includes a cell region (I) including a word line, a drain select line (DSL), and a source select line (SSL); an inter-connection region (II) for interconnecting metal with a metal line; and a peripheral circuit region (III) including peripheral circuits. The hard mask layer includes one selected from an oxide film 310, a nitride film 300, and a combination thereof.

In this embodiment, the hard mask layer includes a nitride film 300 and an oxide film 310.

A first polysilicon layer 320 is formed over the oxide film 310.

A first photoresist pattern 330 is formed over the first polysilicon layer 320.

The first photoresist pattern 330 of the cell region (I) defines a word line pattern, a drain select line (DSL) and a source select line (SSL). The first photoresist pattern 330 that defines the word line pattern may have a critical dimension (CD) smaller than that of the first photoresist pattern 330 that defines the DSL pattern and the SSL pattern. The first photoresist pattern 330 that defines the word line pattern has a pitch larger twice than that of a word line pattern which is formed later.

The first photoresist pattern 330 elements formed in the inter-connection region (II) define a part of a pattern to be subsequently formed in the inter-connection region (II). The first photoresist pattern 330 elements formed in the peripheral circuit region (III) preferably define all patterns to be subsequently formed in the peripheral circuit region (III).

Figure 2B:
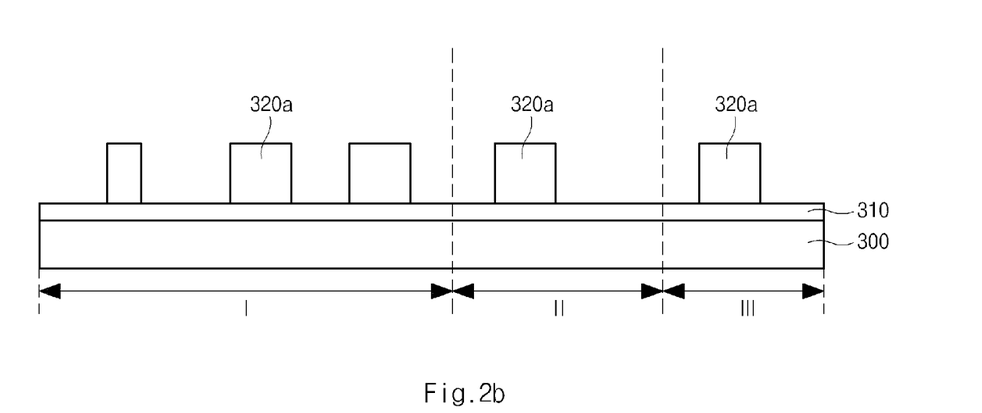

Referring to FIG. 2b, the first polysilicon layer 320 is etched using the first photoresist pattern 330 as a mask to form a first mask pattern 320a.

The first photoresist pattern 330 is then removed.

Figure 2C:
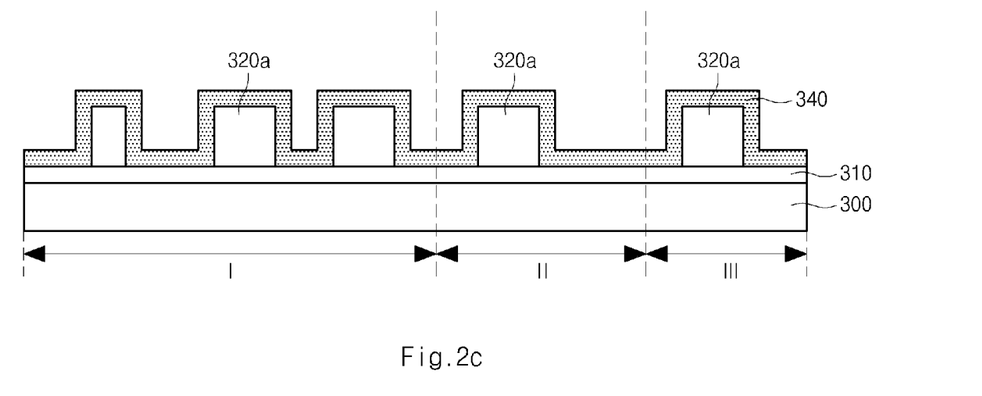

Referring to FIG. 2c, an oxide film 340 having a given thickness is formed over the resulting structure including the first mask pattern 320a.

The oxide film 340 can be deposited to a thickness sufficient to secure a space critical dimension (CD) of the final pattern because the thickness of the oxide film 340 determines the space CD of the final pattern. The space CD refers to the size of a region between adjacent final pattern elements.

Figure 2D:
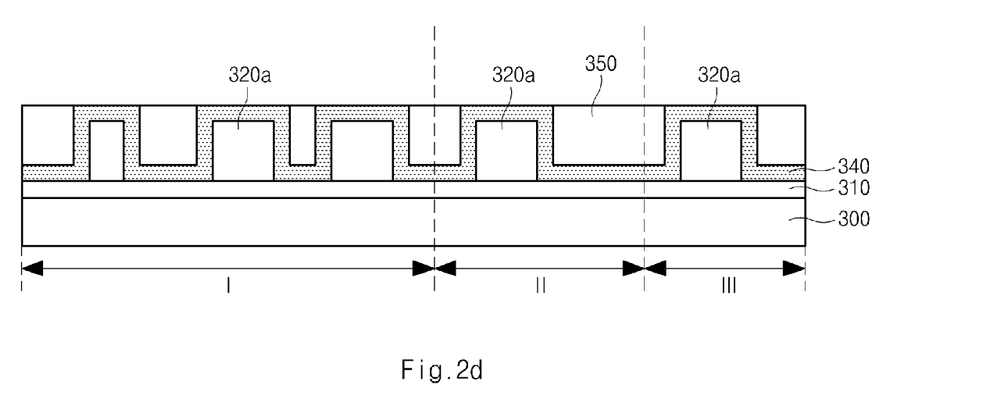

Referring to FIG. 2d, a second polysilicon layer 350 is formed over the resulting structure including the oxide film 340. A planarizing process is performed to expose the oxide film 340.

The second polysilicon layer 350 remains in the region between adjacent first mask pattern 320a elements including the oxide film 340.

The planarizing process is preferably a chemical mechanical polishing (CMP) process. The oxide film 340 deposited over the first mask pattern 320a serves as an etching barrier film for the CMP process.

When the CMP process is performed using the oxide film 340 as a barrier, the entire polysilicon layer is etched, so that residual polysilicon does not remain which requires a second patterning process to remove.

Figure 2E:
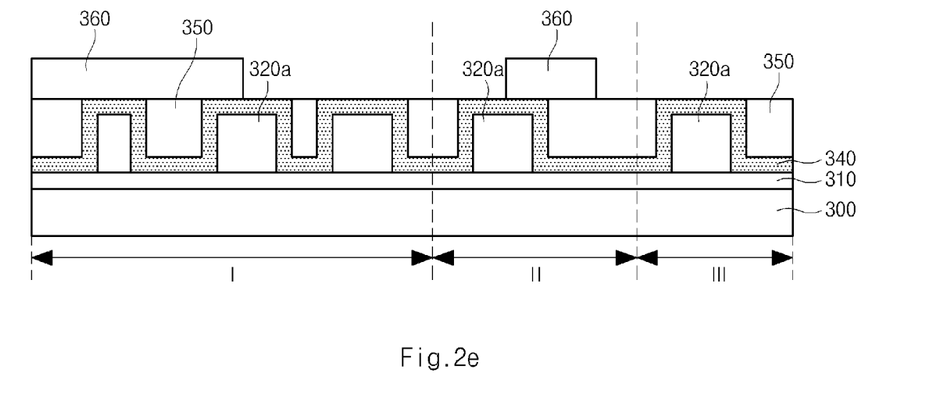

Referring to FIG. 2e, a second photoresist pattern 360 is formed over the semiconductor substrate (not shown) including the planarized second polysilicon layer 350. Preferably, the second photoresist pattern 360 is formed over a portion of the semiconductor substrate (not shown) including the planarized second polysilicon layer 350 so that a portion of the second polysilicon layer 350 remains exposed.

The second photoresist pattern 360 is preferably formed over a local word line region of the cell region (I) and over a local pattern region, which is not defined by the first mask pattern 320a.

The second photoresist pattern 360 element formed in the inter-connection region (II) can be overlapped with the first mask pattern 320a element formed in the inter-connection region (II).

Figure 2F:
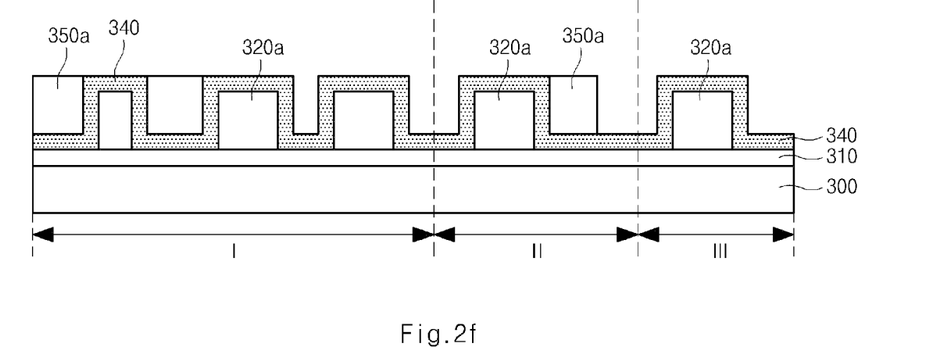

Referring to FIG. 2f, the exposed second polysilicon layer 350 is etched to form a second mask pattern 350a.

The second polysilicon layer 350 between the first mask pattern 320a elements that define the DSL pattern and SSL pattern of the cell region (I) is removed. A second mask pattern 350a is formed adjacent to the first mask pattern 320a element including the oxide film 340 formed in the inter-connection region (II).

The second photoresist pattern 360 is then removed.

Figure 2G:
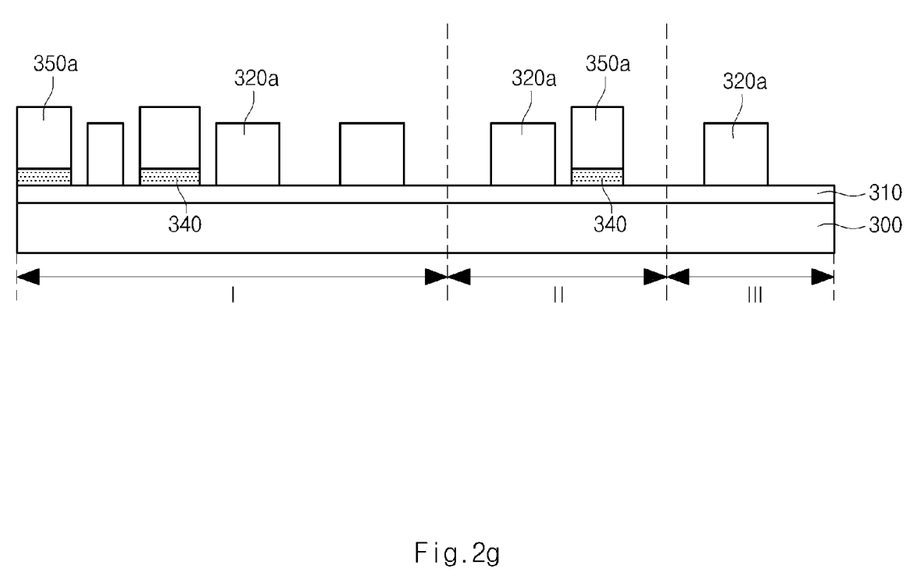

Referring to FIG. 2g, the exposed oxide film 340 is removed, preferably, by a dip-out process.

The second mask pattern 350a serves as a mask, so that the oxide film 340 disposed on a bottom portion of the second mask pattern 350a remains after the dip-out process.

An etching process is performed using the first mask pattern 320a and the second mask pattern 350a as a mask to form a fine pattern in the cell region (I), the inter-connection region (II), and the peripheral circuit region (III). For example, the first mask pattern 320a and the second mask pattern 350a may be used as a mask to form a hard mask pattern (not shown).

As described above, in a method for forming a pattern of a semiconductor device according to an embodiment of the present invention, a polysilicon layer does not remain in a large open area during an etch-back process, so that a material layer that serves as a barrier in a second patterning process is not required. As a result, the method can control a fine CD required in the second patterning process and improve an overlay characteristic.

The above embodiments of the present invention are illustrative and not limitative. Various alternatives and equivalents are possible. The invention is not limited by the type of deposition, etching, polishing, and patterning steps described herein. Nor is the invention limited to any specific type of semiconductor device. For example, the present invention may be implemented in a dynamic random access memory (DRAM) device or non-volatile memory device. Other additions, subtractions, or modifications are obvious in view of the present disclosure and are intended to fall within the scope of the appended claims.

What is claimed is:

1. A method for forming a pattern of a semiconductor device, the method comprising:
   (a) forming a first mask pattern over a semiconductor substrate;
   (b) forming a spacer film over the resulting structure of (a) including the first mask pattern;
   (c) forming a polysilicon layer over the resulting structure of (b) including the spacer film;
   (d) performing a planarizing process on the structure of (c) to expose the spacer film;
   (e) forming a photoresist pattern over a portion of the resulting structure of (d) such that a part of the polysilicon layer of (c) is exposed;
   (f) etching the polysilicon layer of (c) using the photoresist pattern as a mask to form a second mask pattern;
   (g) removing the photoresist pattern; and
   (h) removing the exposed spacer film.

2. The method according to claim 1, further comprising forming a hard mask layer over the semiconductor substrate prior to forming the first mask pattern over the semiconductor substrate.

3. The method according to claim 1, comprising forming the first mask pattern of polysilicon.

4. The method according to claim 1, comprising forming the spacer film of an oxide film.

5. The method according to claim 1, comprising removing the spacer film by a dip-out process.

6. A method for manufacturing a semiconductor device, the method comprising:
   (a) sequentially forming a hard mask layer and a first polysilicon layer over a semiconductor substrate including a cell region, an inter-connection region, and a peripheral circuit region;
   (b) etching the first polysilicon layer to form a first mask pattern;
   (c) forming a spacer film over the resulting structure of (b) including the first mask pattern;
   (d) forming a second polysilicon layer over the resulting structure of (c);
   (e) performing a planarizing process on the structure of (d) to expose the spacer film over a top portion of the first mask pattern;
   (f) forming a photoresist pattern over a part of the resulting structure of (e) such that a part of the second polysilicon layer of (d) is exposed;
   (g) etching the second polysilicon layer of (d) using the photoresist pattern as a mask to form a second mask pattern;
   (h) removing the photoresist pattern;
   (i) removing the spacer film exposed on sidewalls and the top portion of the first mask pattern; and
   (j) etching the hard mask layer using the first and second mask patterns as a mask to form a hard mask pattern.

7. The method according to claim 6, comprising forming the hard mask layer from a material selected from the group consisting of oxide films, nitride films, and combinations thereof.

8. The method according to claim 6, comprising forming the spacer film of an oxide film.

9. The method according to claim 6, comprising performing the planarizing process by a chemical mechanical polishing (CMP) process.

10. The method according to claim 6, comprising forming the photoresist pattern to overlap with a part of a first mask pattern element formed in the inter-connection region and a part of the second polysilicon layer adjacent to the first mask pattern element.

11. The method according to claim 6, comprising forming the photoresist pattern such that the peripheral circuit region is exposed.

12. The method according to claim 6, comprising removing the exposed spacer film by a dip out process.

13. The method according to claim 6, comprising removing the exposed spacer film such that the spacer film formed on a bottom portion of the first mask pattern is not removed.

14. The method according to claim 6, wherein the cell region of the semiconductor substrate comprises a word line pattern, a drain select line (DSL) pattern, and a source select line (SSL) pattern.

15. The method according to claim 14, comprising forming the photoresist pattern such that a region that defines a SSL pattern and a DSL pattern of the cell region is exposed.

16. The method according to claim 14, comprising forming elements of the first mask pattern in the cell region to define a word line pattern, a DSL pattern, and a SSL pattern.

17. The method according to claim 16, comprising forming the first mask pattern element that defines the word line pattern to have a pitch twice as large as that of the word line pattern.

* * * * *